United States Patent [19]

Harvey

[11] Patent Number: 4,745,617
[45] Date of Patent: May 17, 1988

[54] IDEAL DISTRIBUTED BRAGG REFLECTORS AND RESONATORS

[75] Inventor: Robin J. Harvey, Thousand Oaks, Calif.

[73] Assignee: Hughes Aircraft Company, Los Angeles, Calif.

[21] Appl. No.: 31,327

[22] Filed: Mar. 27, 1987

[51] Int. Cl.[4] ............................................. H01S 3/08
[52] U.S. Cl. .................................... 372/96; 372/99; 372/92
[58] Field of Search .................. 372/99, 96, 92, 98, 372/64, 50, 108, 46

[56] References Cited

U.S. PATENT DOCUMENTS

| | | | |
|---|---|---|---|
| 3,884,549 | 5/1975 | Wang et al. | 372/96 |
| 3,898,585 | 8/1975 | Hendrich et al. | 372/96 |
| 4,516,243 | 5/1985 | Utaka et al. | 372/96 |
| 4,575,851 | 3/1986 | Seki et al. | 372/96 |
| 4,648,096 | 3/1987 | Akiba et al. | 372/96 |
| 4,653,059 | 3/1987 | Akiba et al. | 372/96 |
| 4,665,528 | 5/1987 | Chinone et al. | 372/96 |
| 4,701,995 | 10/1987 | Dolan et al. | 372/96 |

Primary Examiner—Leon Scott, Jr.
Attorney, Agent, or Firm—Kenneth W. Float; V. D. Duraiswamy; A. W. Karambelas

[57] ABSTRACT

A method of optimizing the design of waveguide reflector surfaces for high-Q cavities. The method assumes ideal conducting surfaces and proceeds from simple planar waveguide systems which are compatible with resonant standing waves to the development of the allowable surfaces which are necessary to contain the standing waves in a finite system. Apparatus constructed in accordance with the method achieves a Q in excess of 10,000.

30 Claims, 5 Drawing Sheets

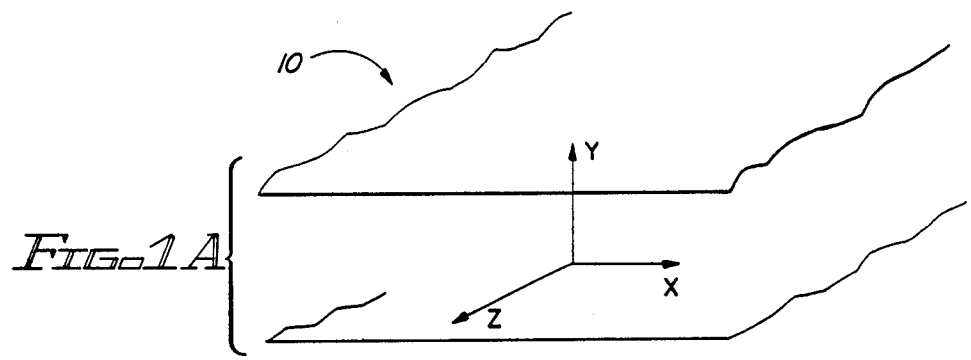
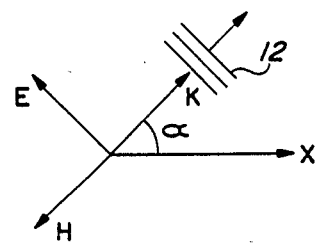
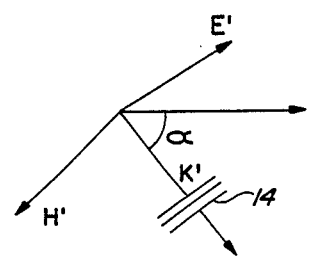
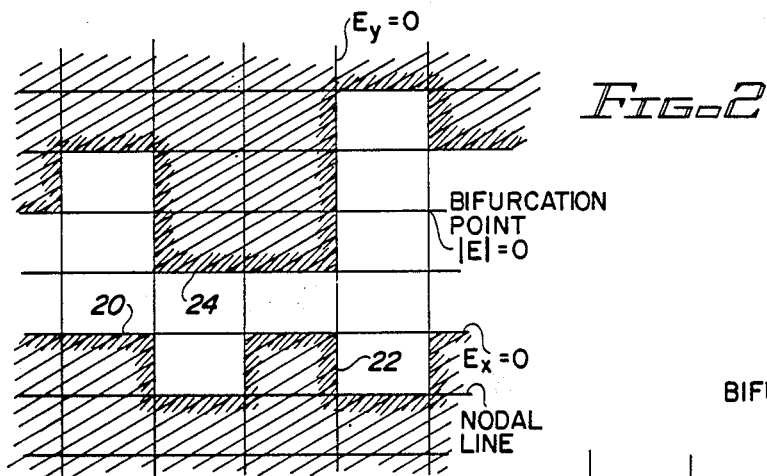
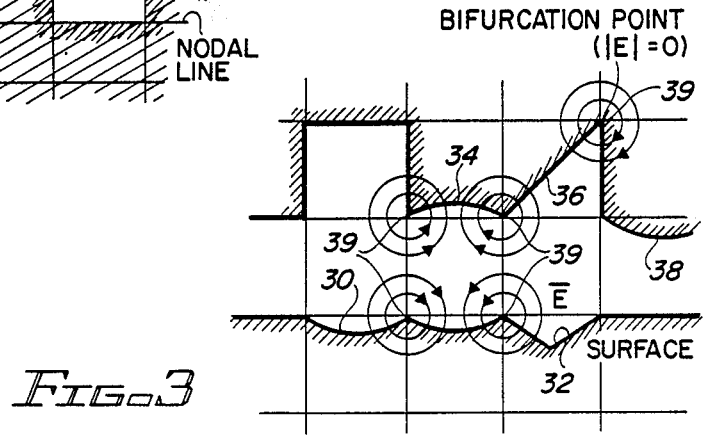

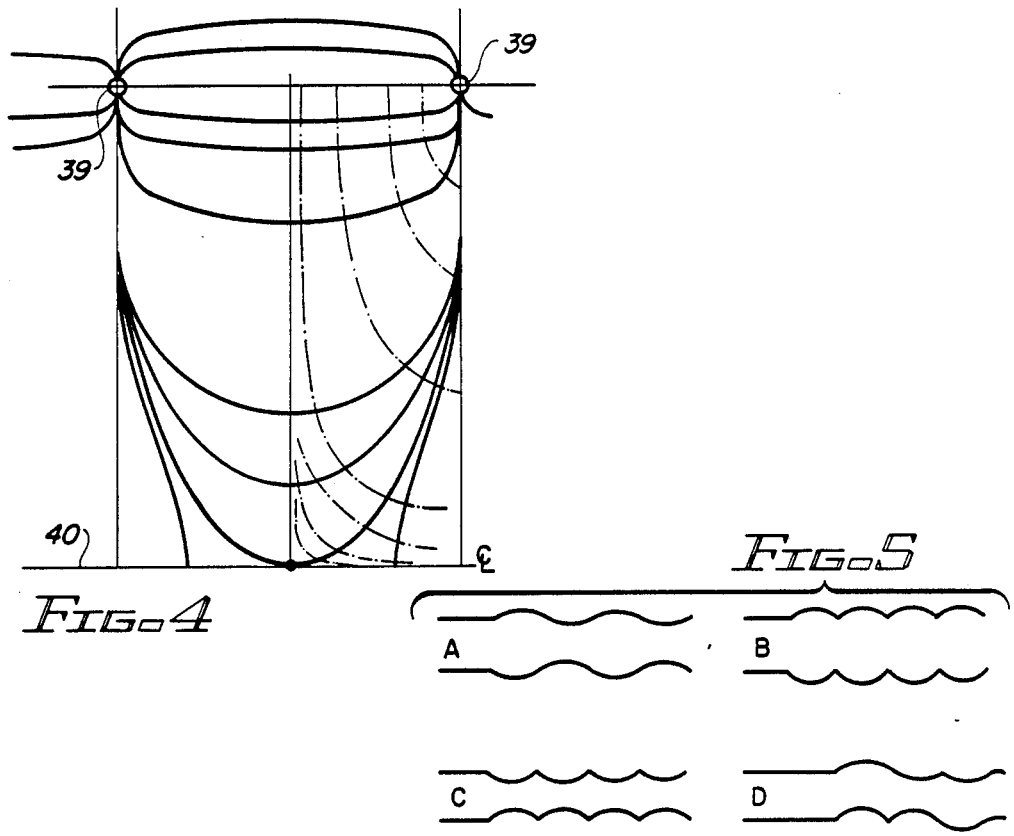
FIG. 4
FIG. 5
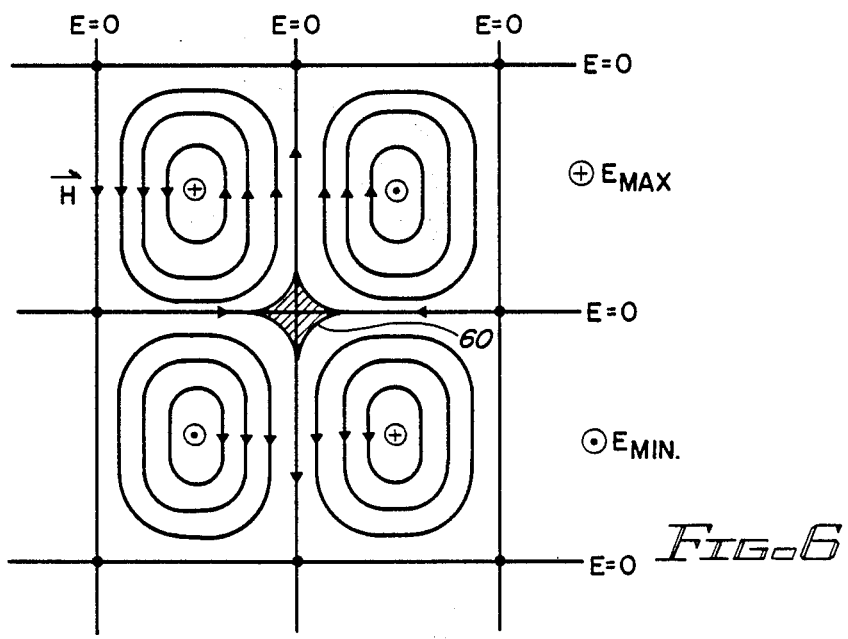
FIG. 6

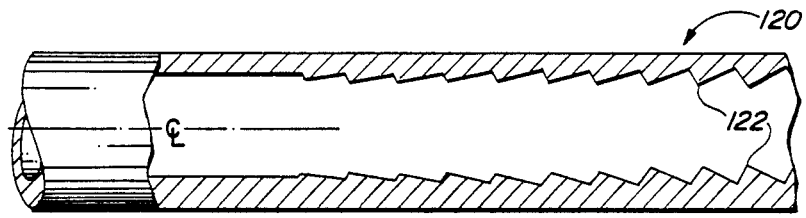
FIG._12
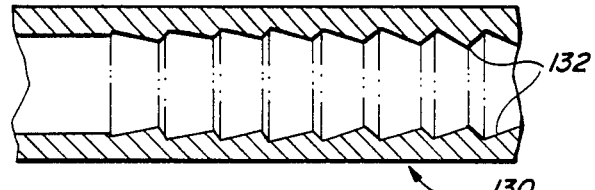
FIG._13
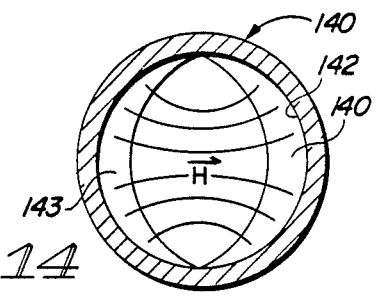
FIG._14
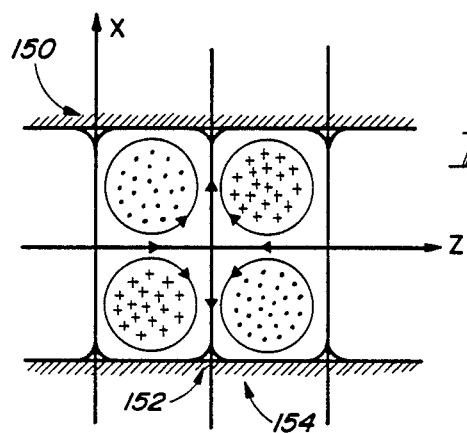
FIG._15A
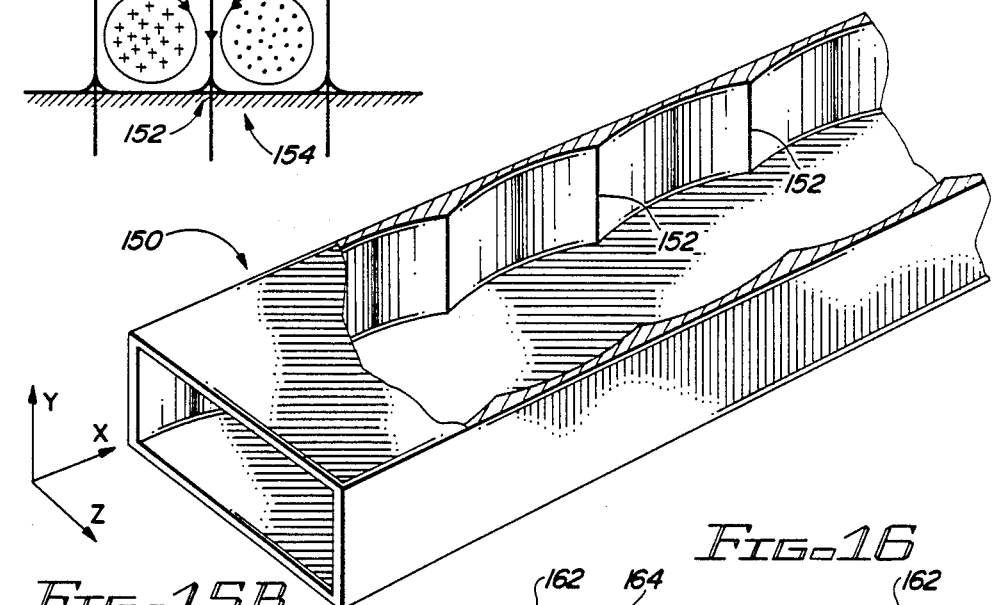
FIG._15B
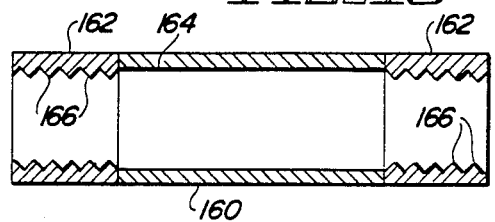
FIG._16

IDEAL DISTRIBUTED BRAGG REFLECTORS AND RESONATORS

BACKGROUND OF THE INVENTION

The present invention relates generally to waveguide reflectors and, more specifically, to the design of particular types of distributed Bragg reflectors such as may be used in a free electron laser.

Free electron lasers typically operate at wavelengths in the infrared or visible bands and utilize mirrors at the opposite ends of their resonating cavities to direct the radiation field along the optical axis of the cavity. An axially directed electron beam is brought into and out of the ends of the cavity by the use of bending magnets. A typical example of a free electron laser (FEL) is illustrated in U.S. Pat. No. 4,438,513 issued in the name of Luis Elias and assigned to the United States of America.

In an FEL operated in the microwave to far-infrared bands, however, a high-Q resonator is usually required to confine the mode. The resonator must also allow passage of an electron beam. The expanding Gaussian-mode patterns of a conventional confocal or a concentric resonator, however, do not easily fit within the bore of the wiggler-magnet array, especially at frequencies below 100 GHz. As a result, the radiation fields of such conventional resonators must be confined by some means along the 30-100 cm interaction length. Since future FELs must be capable of generating very high average power, the resonators therein will have to be overmoded, i.e., use quasi-optical propagation with cross sections larger than one-half wavelength to avoid thermal damage to the resonator structure.

Reflectors utilizing square-wave corrugations operating with the known principle of Bragg scattering relating to constructive interference at certain angles, called Bragg angles, have been previously proposed for use in waveguides. See, e.g., "Waveguide Resonators with Distributed Bragg Reflectors" by R. Kowarschik and A. Zimmerman, *Optica Acta* 1982, Vol. 29, No. 4, pages 455-462. According to the prior art literature, however, the shape of the corrugations has little effect on the reflection coefficient. See, e.g., articles by: Marcuse, *IEEE Journal of Quantum Electronics*, Vol. QE8, pages 661-669, July, 1972; Miles and Grow, *IEEE Journal of Quantum Electronics*, Vol. QE14, No. 4, pages 275-282, April, 1978; and Yariv et al., *IEEE Journal of Quantum Electronics*, Vol. QE13, pages 233-251, April, 1977.

Couplers using diffraction gratings built directly into a dielectric waveguide for use in input or output coupling from the waveguide modes to free-space, or substrate propagating modes, are discussed by Yariv et al., *IEEE Journal of Quantum Electronics*, Vol. QE13, pages 233-251, April, 1977 at pp. 249-251. The waveguide grating couplers discussed by Yariv et al. are built not into metallic waveguides but into dielectric waveguides, and their function is to scatter power out of the waveguide rather than coherently reflecting it inside the waveguide. Also, the corrugations are not blazed. The discussion includes an analysis of the coupling loss of such a waveguide grating with sawtooth-type triangular corrugations.

Bratman et al., in "FELS with Bragg Reflection Resonators Cyclotron Autoresonance Masers Versus Ubitrons", *IEEE Journal of Quantum Electronics*, Vol. QE19, No. 3, pages 282-295, March, 1983, discuss the applications of sinusoidal corrugated reflectors in FELS, Ubitrons and Cyclotron Autoresonance Masers (CARM).

The sawtooth type triangular corrugations shown in FIG. 35 of the Yariv article and the sinusoidal corrugations of Bratman et al. are not spaced apart with an intervening base.

It is known in the field of optics, particularly as related to diffraction gratings, that "blazing" of grooves of a grating will cause it to be particularly reflective of light at a certain wavelength. See, e.g., *Fundamentals of Optics*, Jenkins and White, McGraw-Hill, 1957. As defined in the McGraw-Hill Dictionary of Scientific and Technical Terms, 3rd Edition, a "blaze-of-grating technique" is an optics technique whereby ruled grooves of a diffraction grating are given a controlled shape such that they reflect as much as 80% of the incoming light into one particular order for a given wavelength. Such techniques are also effective in the microwave region where blazed corrugated reflectors may be used to advantage in the design of high-Q FEL resonators.

A certain amount of the development of the microwave devices mentioned above involves, at least to some degree, an empirical approach to the realization of optimal structures. One particular high-Q FEL resonator design has been found in practice to develop an exceedingly high Q which achieved a large coupling coefficient for a relatively short reflector which was not explainable by existing theoretical arguments. Other designs exist which give comparable results but violate both the theoretical and blaze design criteria. Coupled mode theory (CMT) analysis may suggest a potential capability of calculating reflectivity of a given corrugation when higher-order corrections are included but such theory is not yet suitable to use to generate the ideal surface of a given mode reflector.

Empirical progress in reflector design suggests that better reflectors can eventually be designed and tailored to specialized applications, but the present empirical and analytical procedures are not up to the task of identifying the critical conditions or providing the design criteria. One purpose of this disclosure, therefore, is to demonstrate an independent approach to designing a resonator to realize a optimum resonance of a selected mode, as an alternative to the conventional approach of determining what modes will be resonant with what Q in a selected resonator.

SUMMARY OF THE INVENTION

The present invention involves the design of ideal high-Q resonant cavities formed by an overmoded waveguide and axially open distributed Bragg reflectors (DBR). The design principles disclosed herein are general in nature and can also be applied to the design of optimal surfaces for waveguides of variable diameter, coupling sections, and antenna horns for special purposes and for handling overmoded connections between microwave systems. The invention also encompasses particular microwave reflector structures which may be fabricated in accordance with the methods of the invention.

Particular design procedures in accordance with the invention begin with particular design waveforms and involve calculations of the ideal shape of generalized reflectors with optimal quality and capabilities. It will be shown that bifurcation points exist in the ideal surface for TM modes, allowing a continuum of different corrugation amplitudes to be joined together at such points to make up a closed surface. In the TM mode case, cusped solutions exist which have potentially higher Q and less mode coupling errors than smoothly corrugated surfaces.

The following discussion begins with the fundamentals of the approach used in designing the waveguide surfaces for high-Q cavities. Ideal conducting surfaces are assumed and the design discussion starts from simple planar waveguide systems which are compatible with resonant standing waves. Next an intensity modulation is added in order to demonstrate the axial variation in the allowable surfaces necessary to contain the standing waves in a finite system, followed by generalization to rectangular and cylindrical guides. During this discussion it is necessary to discriminate between TE and TM types of boundary conditions, and these differences are treated separately in the planar case. It is not always possible to isolate the two types of boundary conditions in the more general waveguide, but the fundamental process of defining a surface is discussed.

BRIEF DESCRIPTION OF THE DRAWINGS

A better understanding of the present invention may be realized from a consideration of the following detailed description, taken in conjunction with the accompanying drawings in which:

FIGS. 1A–1C are schematic representations of a portion of a planar waveguide and of particular field relationships existing therein which are presented to illustrate certain boundary conditions;

FIG. 2 is an enlarged schematic representation of certain random geometrical surface patterns satisfying the general solution of standing wave equations in a particular planar waveguide;

FIG. 3 is a schematic diagram of surfaces representing a complete set of solutions for boundary surfaces of the standing wave equations for a planar waveguide;

FIG. 4 is a side view of a portion of a theoretical waveguide in which numerically calculated surfaces are plotted;

FIGS. 5A–5D are schematic representations of the shapes of four types of reflectors which may be attached to a conventional waveguide to form a resonator;

FIG. 6 is a diagram of theoretical corrugation contours prescribed by TE xode equations;

FIG. 12 is a schematic cross section of a particular reflector portion of a circular waveguide having a surface pattern developed in accordance with the present invention;

FIG. 13 is a schematic cross sectional diagram like FIG. 12 but for a different circulator resonator;

FIG. 14 is a schematic representation of an end view of a circular waveguide corrugation pattern for an asymmetric energizing TE mode;

FIGS. 15A and 15B are schematic representations of an additional example of a particular TE mode rectangular waveguide having corrugations developed in accordance with the present invention; and FIG. 16 is a schematic cross sectional view generally indicating a reflector in which particular surface configurations developed in accordance with the present invention may be installed.

DESCRIPTION OF THE PREFERRED EMBODIMENT

Figure 7:
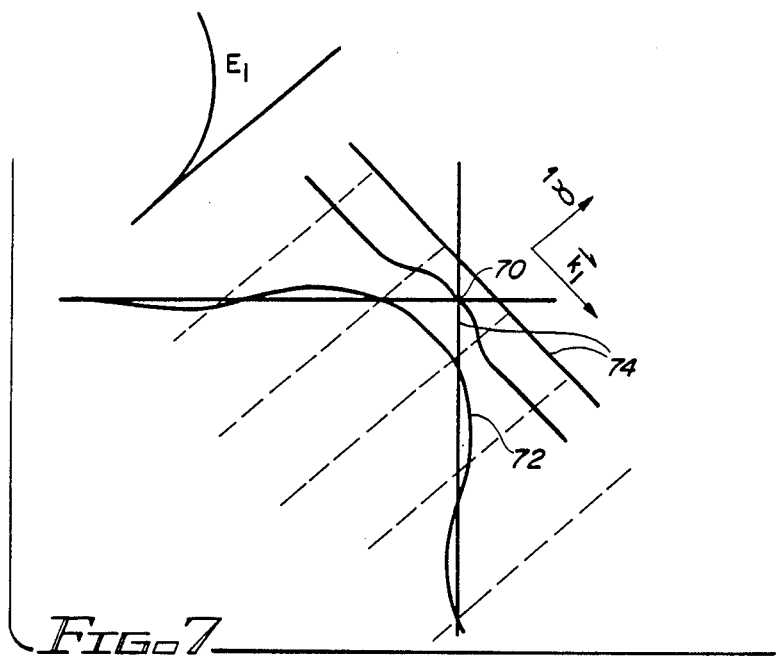
FIG. 7 is a diagram indicating the shaping of an electric field in a particular corner portion of a waveguide.

A. Planar Waveguides.

The design procedure is explained by starting with simple planar waveguides such as the waveguide portion 10 represented schematically in FIG. 1A with the xyz coordinate system oriented as indicated. In FIG. 1A, wave propagation takes place in the x direction with the waveguide or resonator walls located symmetrically above and below the y=0 axis in the y direction. While the vector fields can point in any of the three orthogonal directions, it is assumed (by standard convention) that there is no z dependence of the fields and the guide is infinite in the z and x directions.

There is a significant difference between the solutions for the surface in the travelling and standing wave cases. The smooth-walled-waveguide solutions of the travelling wave case are the most restrictive and most well known. In the standing wave case, additional solutions become possible due to the presence of stationary nodes. These additional solutions act to strongly couple the oppositely travelling waves.

1. Boundary Conditions and Surface Generators.

The conventional boundary conditions for an ideal metal/vacuum interface are: (1) at the surface the electric field is everywhere normal to the surface, and (2) the magnetic field is everywhere parallel to the surface, i.e.

$$E \cdot n = 0, \quad (1)$$

and $$H \times n = 0. \quad (2)$$

The self-consistent solution requires that at the surface $$E \cdot H = 0 \quad (3)$$

or equivalently, the vectors H and ExH are orthogonal and lie in the surface. Thus they may be used to generate the surface by analytical means. FIGS. 1B and 1C show the vector relationships for two different wave conditions.

The approach followed is that one first chooses the wave form of interest and then asks what surfaces can be applied which do not interfere with the wave on at least one side of the surface. Referring to FIGS. 1B and 1C, assume two symmetric travelling waves 12 and 14 are present; these propagate at angles of $+/-\alpha$ to the x axis with the same frequency and magnitude of the wave numbers (asymmetric or higher order modes may also be assumed, but no significantly new physics is encountered). In general the waves can be decomposed into transverse magnetic TM and transverse electric TE wave components. The TM and TE waves lead to different boundary shapes.

2. TM Polarization.

In the TM case the magnetic field is in the z direction and upward and downward waves travelling in the negative x direction are given by $$H_z = H[e^{i(k_x x + k_y y + \omega t)} + e^{i(k_x x + k_y y + \omega t)}] \quad (4)$$

$$= \frac{He^{i(k_x x + \omega t)}}{2} \cos(k_y y) \quad (5)$$

$$i\omega E_x = \frac{-\epsilon H k_y e^{i(k_x x + \omega t)}}{2} \sin(k_y y) \quad (6)$$

$$i\omega E_y = \frac{i\epsilon H k_x e^{i(k_x x + \omega t)}}{2} \cos(k_y y) \quad (7)$$

In this configuration H is everywhere parallel to the surface, satisfying Equation 2. The normal to the surface $y = y(x)$ has vector components $$n = \frac{(E_x, E_y)}{\sqrt{E_x^2 + E_y^2}} \quad (8)$$

$$dy/dx = -E_x/E_y = ik_y \tan(k_y y)/k_x \quad (9)$$

The slope of y(x) is imaginary unless the tangent vanishes, or unless $$k_y Y = m\pi \quad (10)$$

where m is an integer.
(If the real forms of the vectors were used, as will be done below, instead of the complex notation, then the slope would be time dependent unless the same tangent factor vanishes according to Equation 10.) This procedure leads to disconnected plane surfaces parallel to the x axis, as defined by Equation 10, as the only surfaces which will not interfere with a symmetric travelling wave. The angle of propagation of the two elemental waves and the frequency determine the spacing between the planes through the transverse wave number $k_y$. 3. Standing Waves.

When a pair of counter-propagating waves are introduced, standing waves are set up with $$H_z = H\cos(k_x x)\cos(k_y y)\cos(\omega t) \quad (11)$$

$$E_x = \frac{-Hk_y}{\omega} \cos(k_x x)\sin(k_y y)\sin(\omega t) \quad (12)$$

$$E_y = \frac{Hk_x}{\omega} \sin(k_x x)\cos(k_y y)\sin(\omega t) \quad (13)$$

$$dy/dx = \frac{k_y \tan(k_y y)}{k_x \tan(K_x x)} \quad (14)$$

As in the case of the travelling waves, valid particular solutions for the surface are given by Equation 10, where Ey=0; but, in addition, vertical boundaries also exist where the slope is infinite, $k_x x = m\pi$ and $E_x = 0$. Since these two kinds of solutions intersect each other (at bifurcation points where $|E| = 0$), a somewhat more general solution may take on random geometrical patterns as indicated in FIG. 2, wherein the depicted grid represents dimensions of one-half wavelength in the x and y directions, respectively. These solutions are used to form the rectangular corrugations commonly considered by many designers; these have a basic period of one axis wavelength, and a depth (usually much larger, and often too large for practical apparatus) of one transverse wavelength. While these rectangular corrugations such as 20, 22 and 24 are interesting, they are not the only solutions.

4. The Complete Set of Solutions.

The complete set of solutions for boundary surfaces must include all surfaces which are perpendicular to the electric field in addition to those where $|E| = 0$. These general solutions may be obtained by integrating Equation 14 to obtain the transcendental form for y(x).

$$A\sin^{k_x}(k_y Y) = B\sin^{k_y}(k_x x) \quad (15)$$

where A and/or B are constants of integration.
For horizontally aligned surfaces $$\sin(k_y Y) = \sin(k_y \Delta)\sin P (k_x x) \quad (16)$$

where $$p = \frac{k_y}{k_x} \quad (17)$$

and the constants of integration are replaced by $\Delta$ which is set equal to the amplitude of the corrugation. A similar equation (where x and y are interchanged) holds for the vertical types of boundaries, and examples of the full set are represented schematically in FIG. 3, showing that a variety of shapes of corrugation surfaces 30, 32, 34, 36, 38 may satisfy the boundary surface conditions. Bifurcation points ($|E| = 0$) exist where the shapes may be joined and are designated by reference numerals 39.

Numerically calculated surfaces are represented in FIG. 4 for a propagation angle of 20°. Here the center 40 of the waveguide is at the bottom where y=0.

5. Resonator Choices.

As with the planar boundaries, which are a limiting case, the boundaries also intersect at the same (bifurcation) points, and solutions may be joined at those points to suit the application. FIG. 5 shows four types of reflectors which satisfy the boundary conditions for planar resonators in the lowest order mode which are attached to a conventional (TM₁) planar waveguide to form a resonator. These are: (A) smoothly matched boundaries with a period of $\lambda\pi$, (B) outwardly displaced glands with cusped intersections and period $\lambda\pi/2$, (C) inwardly displaced glands also with period $\lambda\pi/2$, and (D) randomly matched corrugations. An interesting feature of the cusped solutions is that the optimum gland location corresponds to the normal plane of the uncorrugated waveguide, but is displaced from it by $\Delta$.

In the design of a specific resonator, consideration must be given to the effective coupling strength (which would grow as the corrugation height is increased) and the effect of the particular corrugation pattern chosen on scattering and damping other undesired waves or modes. For example, since the E field is small in the neighborhood of the bifurcation points, small errors in the shape there would not strongly affect the resonance. Thus, waves with harmonic axial-mode numbers (and pseudo-harmonic frequencies) would be expected to resonate in the shallow-gland cases along with the fundamental, as has been observed.

6. Higher-order Modes.

Higher-order TM-mode solutions may be simply generated by recognizing that for a planar waveguide the even and odd mode numbers, m, in Equation 10 correspond to $\sin(k_y Y)$ and $\cos(k_y Y)$ terms respectively in Equations 5 and 11. The normal waveguide boundary is moved outward to the next repeating pattern, e.g. an integral number of half wavelengths to the corresponding y position.

7. TE Modes.

TE modes satisfy significantly different boundary conditions than TM modes. The form of the equations is similar, with E and H reversing roles, but the electric field is everywhere parallel to the surface and the only exact solution available for the surface is where the field is exactly zero, e.g. where $$E_z = E\cos(K_x x)\cos(K_y Y) = 0 \tag{18}$$

8. Nearly Ideal TE Solutions and Energy Loss.

The exact TE solutions are of the rectangular form shown in FIG. 2. For real resonators one is able to accept a certain level of loss by locating the corrugations where the amount of energy available to be lost is negligibly small. The cyclic energy which is transferred back and forth between electric and magnetic energy in a given corrugation volume, V, is given approximately by $$W = \sim \epsilon s E^2 dV/2 \tag{19}$$

This energy may be lost by the wave when the corrugations short out the electric field and redirect the magnetic field lines to conform to the surface. This allows the contribution to the resonator Q to be estimated by comparing W to the energy stored in the corresponding section, $W_0$, of unperturbed waveguide $$Q = W_0/W \tag{20}$$

The Q factor will be large if corrugations are kept within roughly hyperbolic contours which follow H-field lines, e.g. as shown by the shaded area 60 in the center of FIG. 6. As with FIGS. 2 and 3, the individual cells of the depicted grid of FIG. 6 are of half wavelength dimension. Taking the corrugation itself to be elliptical, Q is given in this case by the fourth power of the corrugation size $$Q \sim 8/(k_y \Delta)^4, \tag{21}$$

as an approximation, or Q is greater than 10,000 when $k_y \Delta$ is less than 0.16. Unlike the TM modes, these corrugations have glands at the position of the unperturbed waveguide wall, and have a length to corrugation width and height consistent wrth measured blazed corrugations. The above analysis leading to Equation 21 is intended to be an estimate of the losses and may be in error by a factor of roughly two.

9. Ideal TE Surfaces by Invoking Exponential Waves.

A procedure does exist for generating surfaces which extend into the corners of the rectangular region bounded by the E=0 nodal lines. If the nodal lines are assumed to be conducting, then it is not necessary that the partial wave solutions to Maxwell's equations be continuous across the boundary. As shown in FIG. 7, assume an additional wave of the form $$E_z = e_1 \cos(k_1(x+y)+\phi)^{65} e^{(x-y)} \tag{22}$$

where $$k_1{}^2 = y^2 + k_0{}^2 \tag{23}$$

and $k_1$ may be a harmonic of $k_x$. This wave may be adjusted to be negligibly small in every region except the corner of interest in the rectangle 70. Here its amplitude, phase ($\phi$), and wave length are adjusted to cancel the rapidly falling principal mode, allowing a new E=0 surface 72 to extend in from the corner 70 defining the prior E=0 surface 74. A single such wave would also cause the surface to bulge outward across the original nodal line 74 by a small amount. This effect can be corrected by combining several of these waves propagatrng at slightly different angles and with differing constants. The net effect is to generate a closed surface with a calculable corrugation shape which has no significant impact on the mode near the axis of the waveguide due to the rapid exponential fall of the wave.

The heuristic approach to using non-ideal corrugatrons in the previous section is an indication that, as for the TM modes, there are a continuum of possible surfaces which will support the modes required. However, the larger the corrugation, the more the exponential terms will extend their influence into the center of the guide, with the heurrstic loss estimates suggesting the extent of the extensron.

B. Wave Modulation in Space

The corrugations discussed above are consistent with standing waves of the same mode as would be present in the uncorrugated waveguide. Although the corrugatrons may act as reflectors in responding to a transient pulse, it is not evident from the above analysis what the effective reflectivity would be, and such corrugated sections must actually transmit (or at least diffuse) power at their ends in the steady state. In order to model the case where in the steady state the reflectors act as true reflectors, it is necessary to introduce wave solutions where the wave amplitude varies along the axis of propagation.

Consider the following spatial modulation along the axis of the planar guide as an example $$f = \left(1 - \sin^\beta\left(\frac{\pi x}{2L}\right)\right)\cos(k_x x) \tag{24}$$

Figure 8:
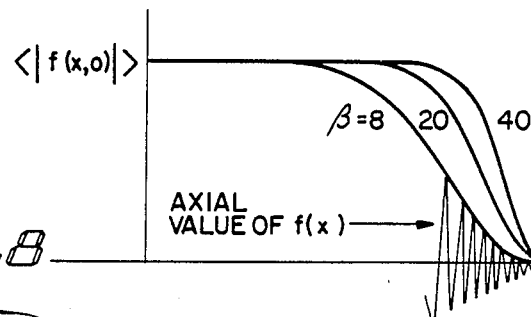
FIG. 8 is a waveform diagram illustrating spatial modulation along the axis of a planar waveguide.

The function is shown in FIG. 8 for several values of $\beta$; these functions vanish at x=L at rates which increase with $\beta$, thereby modeling reasonably realistic resonators. A useful feature of this choice of f is that it may be represented by a finite number of longitudinal modes. The Fourier transform of f may be used to generate these longitudinal eigenmodes which sum to the modulated and periodic axial wave. The off-axis solutions are then found by satisfying the wave conditioni $$k_x{}^2 + k_y{}^2 = K_0{}^2 = \frac{\omega^2}{c^2} \tag{25}$$

In the following example $\beta=8$, and there are four sidebands on each side of the center longitudinal mode which is taken as having index $n=100$, i.e.

$$f(x,y) = \sum_{l=-4}^{4} f_l \cos\left(\frac{\pi(n+l)x}{L}\right) \quad (26)$$

$$f_l = \delta_{l,0} - \frac{(-1)^l C_l^\beta}{2^\beta} \quad (27)$$

$$k_x = \frac{\pi(n+l)}{L} \quad (28)$$

where $\delta=0$ unless $l=0$, and $C_l^\beta$ is the binomial coefficient.

It is convenient to use the series form of the function to evaluate the amplitude of the electric and magnetic field components everywhere within the waveguide. Then by applying the surface conditions developed with Equations 1-14 and plotting the surfaces, one is able to develop accurate models for the surface of a waveguide which has the most ideal shape capable of containing and resonating a composite of such longitudinal modes without coupling to other modes and with minimum loss.

Figure 9:
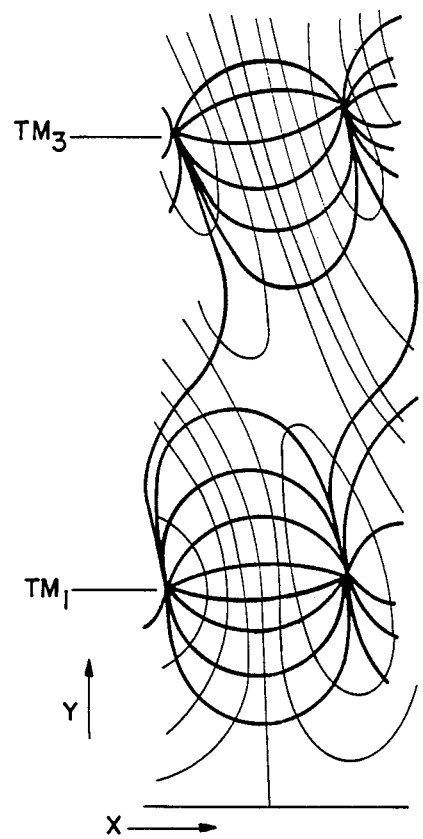
FIG. 9 is a schematic diagram of a plot of electric field distribution of TM modes.

Examples of planar $TM_1$ and $TM_3$ mode solutions are shown in FIG. 9. FIG. 9 shows field distributions and possible surfaces at $x=0.8L$ for $TM_1$ and $TM_3$ modes. The general features are similar to the infinite resonator case in the center of the modulated resonator, but the TM (H=0) nodal lines are distorted strongly where the wave is strongly attenuated near the ends of the resonator. In fact the now curvilinear surfaces become degenerate and no longer cross. As a consequence, the horizontal components of the TM surfaces become gradually more tilted and curved as the surface is extended to the end of the waveguide. The tilt is due to the blaze required to match to the more rapid decay of the signal intensity.

Figure 10:
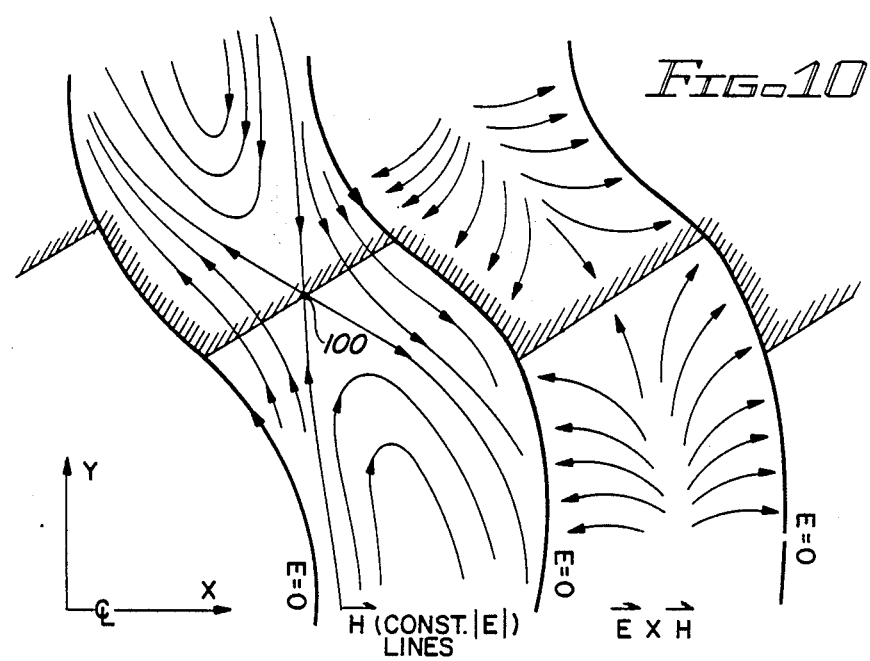
FIG. 10 is an enlargement of a plot as in FIG. 9 for TE modes on which lines have been superimposed representing conductive boundaries of a waveguide structure.

FIG. 10 illustrates mode-matched surfaces (E=0) for the $TE_1$ mode. In the TE case (FIG. 10), there is no continuous surface extending from one end of the waveguide to the other along which E=0. This appears to be a fairly representative result. As for the unmodulated waves, it is possible to close the corners by adding exponential partial waves in these regions, but the heuristic approach to estimating a minimum energy bridge is more practical.

The simplest procedure is to plot the distribution of electric field (as has been done in FIG. 9), and identify a location of minimum energy loss in which to place a conductive boundary which bridges the degenerate E=0 nodal lines. Such surfaces are readily identified in the plot as lines crossing through the saddle points 100 in the electric field intensity, see FIG. 10. In the neighborhood of the bridge the energy density associated with the electric field is typically less than 0.004 times the peak energy density in the center of the resonator and the effective volume ratio of the bridge region (estimated by observing the radius of curvature of the electric field amplitude at the saddle point) is about 3%, leading to an estimate of the Q of over 10,000. Since the losses are strongest at the ends of the resonator, the actual Q may be considerably higher.

C. Non-Planar Geometries

Figure 11:
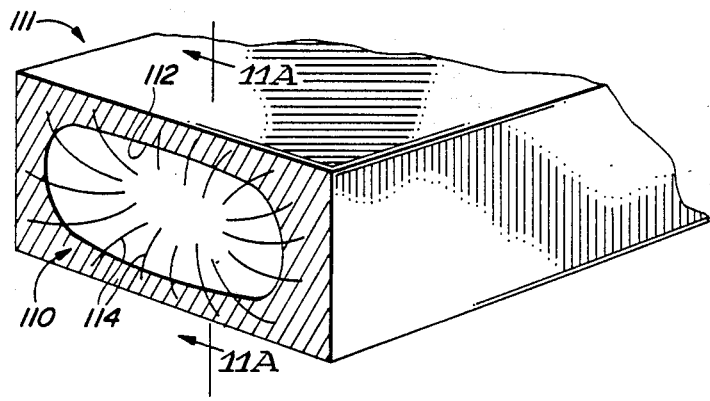
FIGS. 11 and 11A represent schematically the cross section near the end of a particular mode reflector in a rectangular resonator.
Figure 11A:
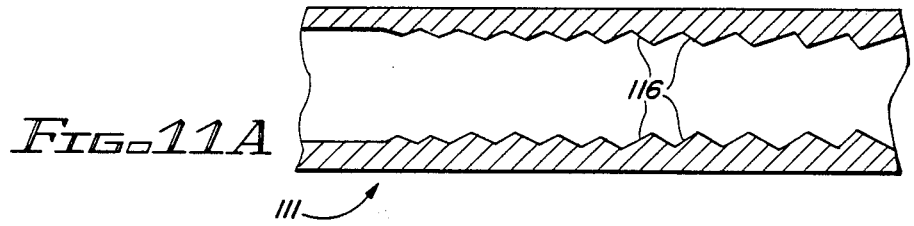

The distinctions between TE and TM boundary modes become less meaningful when three-dimensional propagation is considered in corrugated rectangular and cylindrical waveguides. Nevertheless the principles developed above can be readily applied to mapping out optimal surfaces. For example, the cross section 110 near the end of a $TM_{11}$-mode reflector 111 in a rectangular resonator is shown in FIGS. 11 and 11A. As before, the surfaces are derived by mapping the H vector lines 112 around the circumference of the corrugation and the ExH vector lines 114 along the axial direction of the guide. One has a choice of amplitude and sign of the corrugation at each bifurcation point 116 as shown in FIG. 11A, a cross-section of FIG. 11 taken at the plane A-A.

The circular waveguide follows the same pattern for circularly symmetric modes such as $TM_{01}$, as indicated by the circular reflector 120 with corrugation 122 in FIG. 12, and the $TE_{01}$ xode shown by the circular reflector 130 with corrugation 132 in FIG. 13. When asymmetric TE modes, such as the $TE_{11}$ mode, are considered, the corrugation pattern will take on an azimuthally modulated pattern such as is indicated in FIG. 14, which is an end view of a $TE_{11}$ corrugated resonator 140. The normal waveguide surface is indicated at 142 while the corrugations are designated by the reference numerals 143, 144. The analysis of the surfaces consistent with these waves involves solving for the roots of transcendental and Bessel functions which are best solved as special cases on a computer.

An additional example of a $TE_{02}$ rectangular waveguide 150 is shown in FIGS. 15A and 15B. The cusped corrugations 152 are shown projecting inwardly from the wall 154. The Equations governing this mode structure are:

$$E_y = E_0 \sin\left(\frac{\pi z}{b}\right) \sin\left(\frac{\pi x}{a}\right) \cos \pi t \quad (29)$$

$$H_x = -H_1 \cos\left(\frac{\pi z}{b}\right) \sin\left(\frac{\pi x}{a}\right) \sin \pi t \quad (30)$$

$$H_z = H_2 \sin\left(\frac{\pi z}{b}\right) \cos\left(\frac{\pi x}{a}\right) \sin \pi t \quad (31)$$

This mode is independent of y.

FIG. 16 is a schematic representation of a resonator 160 of generalized design in which reflectors in accordance with the present invention may be installed. In FIG. 16, a pair of reflectors 162 are positioned at opposite ends of a waveguide 164 to form the resonator 160. The cusped corrugations of reflectors in accordance with the present invention are represented in FIG. 16 by the internally directed teeth 166 at each end of the resonator 160. As may be noted from the detail shown in FIGS. 11A, 12 and 13, the corrugations such as 116 are not shaped alike. Rather, the shape and depth of the corrugations varies as a function of position within the reflector element.

Although there have been described above specific arrangements of ideal distributed Bragg reflectors and resonators in accordance with the invention for the purpose of illustrating the manner in which the invention may be used to advantage, it will h=appreciated that the invention is not limited thereto. Accordingly, any and all modifications, variations or equivalent arrangements which may occur to those skilled in the art should be considered to be within the scope of the invention as defined in the annexed claims.

What is Claimed is:

1. The method of designing an ideal distributed-Bragg reflector for a microwave waveguide comprising the steps of:
   selecting a signal waveform for propagation as a symmetric travelling wave within the reflector; and
   determining those surfaces which do not interfere with the symmetric travelling wave having a transverse magnetic polarization by solving the equation
   $\sin(k_y Y) = \sin(ky\Delta)\sin P\,(k_x x)$ for horizontally aligned surfaces and the equation $\sin(k_x x) = \sin(k_x \Delta)\sin^r(k_y Y)$ for vertically aligned surfaces;
   where
   $k_y$ is the transverse wave number,
   $k_x$ is the axial wave number,
   $p = ky/kx$,
   $r = kx,ky$, and
   $\Delta$ is set equal to the amplitude of the corrugation, being the transverse spacing at a surface boundary between adjacent horizontally aligned surfaces.

2. The method of claim 1 further including the step of joining a plurality of the thus-determined surfaces at adjacent boundary points to form a reflector having a plurality of corrugations therein.

3. The method of claim 2 wherein the reflector satisfies the boundary conditions for planar resonators in the lowest order ($TM_1$) mode.

4. The method of claim 3 wherein the surfaces are joined with smoothly matched boundaries with a period of $\lambda\pi$.

5. An axially open distributed-Bragg reflector fabricated in accordance with the method of claim 4.

6. The method of claim 3 wherein the joined surfaces have outwardly displaced glands with cusped intersections and a period of $\lambda\pi/2$.

7. An axially open distributed-Bragg reflector fabricated in accordance with the method of claim 5.

8. The method of claim 3 wherein the surfaces are joined to form inwardly displaced glands with a period of $\lambda\pi/2$.

9. An axially open distributed-Bragg reflector fabricated in accordance with the method of claim 8.

10. The method of claim 3 wherein the surfaces are joined with randomly matched corrugations.

11. An axially open distributed-Bragg reflector fabricated in accordance with the method of claim 10.

12. An axially open distributed-Bragg reflector fabricated in accordance with the method of claim 2.

13. A high-Q resonant cavity comprising a pair of axially open distributed-Bragg reflectors as claimed in claim 10 joined to the opposite ends of a waveguide section.

14. The method of designing an ideal distributed-Bragg reflector for a microwave waveguide comprising the steps of:
   selecting a signal waveform for propagation as a symmetric travelling wave within the reflector; and
   determining those surfaces which do not interfere with the symmetric travelling wave having a transverse electric polarization by solving the equation $E_z = E\cos(k_x x)\cos(k_y Y) = 0$ where
   $E_z$ is the electric field parallel to the surface,
   $k_x$ is the axial wave number,
   $k_y$ is the transverse wave number.

15. The method of claim 12 further including the step of joining a plurality of thus-determined surfaces in successive corrugations by locating vertically aligned surfaces as conductive boundaries between horizontally aligned surfaces at points of minimum loss.

16. An axially open distributed-Bragg reflector fabricated in accordance with the method of claim 15.

17. A high-Q resonant cavity comprising a pair of axially open distributed-Bragg reflectors as claimed in claim 15 joined to the opposite ends of a waveguide section.

18. The reflector of claim 15 wherein the reflector has a generally rectangular cross section and wherein the curvilinear corrugations are formed with approximately sawtooth slopes of alternating rectilinear and curvilinear sections.

19. The reflector of claim 18 wherein the horizontal components of the corrugation surfaces are more tilted and curved near the remote end of the reflector than at the end of the reflector adjacent the waveguide.

20. The reflector of claim 15 wherein the reflector has a generally cylindrical cross section and wherein the horizontal components of the corrugation surfaces are more tilted and curved near the remote end of the reflector than at the end of the reflector adjacent the waveguide.

21. An axially open distributed-Bragg reflector for a microwave waveguide comprising:
   a plurality of opposed walls joined contiguously and circumferentially to surround a central axial opening;
   axially contiguous segments of said wall forming a series of corrugations corresponding to bifurcation points in the ideal wall surface for TM modes;
   said corrugations being shaped to avoid interference with a symmetric travelling wave having a transverse magnetic polarization within the reflector in accordance with the equation $\sin(k_y Y) = \sin(ky\Delta)\sin P\,(k_x x)$ for horizontally aligned surfaces and the equation $\sin(k_x x) = \sin(k_x x) = \sin^r{(k_y Y)}$ for vertically aligned surfaces;
   where
   $k_y$ is the transverse wave number,
   $k_x$ is the axial wave number,
   $p = ky/kx$,
   $r = kx/ky$, and
   $\Delta$ is set equal to the amplitude of the corrugation, being the transverse spacing at a surface boundary between adjacent horizontally aligned surfaces.

22. The reflector of claim 21 wherein adjacent surfaces are joined with smoothly matched boundaries with a period of $\lambda\pi$.

23. The reflector of claim 22 wherein the joined surfaces have outwardly displaced glands with cusped intersections and a period of $\lambda\pi/2$.

24. The reflector of claim 22 wherein the surfaces are joined to form inwardly displaced glands with a period of $\lambda\pi/2$.

25. An axially open distributed-Bragg reflector for a microwave waveguide comprising:
a plurality of opposed walls joined contiguously and circumferentially to surround a central axial opening;
axially contiguous segments of said wall forming a series of corrugations corresponding to bifurcation points in the ideal wall surface for TM modes;
said corrugations being shaped to avoid interference with a symmetric travelling wave having a transverse electric polarization in accordance with the equation $$E_z = E\cos(k_x x)\cos(k_y Y) = 0$$

where
$E_z$ is the electric field parallel to the surface,
$k_x$ is the axial wave number,
$k_y$ is the transverse wave number.

26. The reflector of claim 25 wherein the vertically aligned surfaces are located as conductive boundaries between horizontally aligned surfaces at points of minimum loss.

27. A high-Q resonant cavity comprising, in combination, a pair of axially open distributed-Bragg reflectors as claimed in claim 26 joined to the opposite ends of a waveguide section 28. The combination of claim 27 wherein the horizontal components of the corrugation surfaces are more tilted and curved near the remote end of the reflector than at the end of the reflector adjacent the waveguide 29. The combination of claim 27 wherein the reflector has a generally cylindrical cross section and wherein the horizontal components of the corrugation surfaces are more tilted and curved near the remote end of the reflector than at the end of the reflector adjacent the waveguide.

30. The reflector of claim 25 wherein the reflector has a generally retangular cross section and wherein the curvilinear corrugations are formed with approximately sawtooth slopes of alternating rectilinear and curvilinear sections.

* * * * *